United States Patent
Buynoski

(10) Patent No.: US 6,255,147 B1
(45) Date of Patent: Jul. 3, 2001

(54) SILICON ON INSULATOR CIRCUIT STRUCTURE WITH EXTRA NARROW FIELD TRANSISTORS AND METHOD OF FORMING SAME

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/494,997

(22) Filed: Jan. 31, 2000

(51) Int. Cl.[7] ................................ H01L 21/84
(52) U.S. Cl. ............................ 438/164; 438/149
(58) Field of Search ...................... 438/149, 151, 438/163, 164, 424

(56) References Cited

U.S. PATENT DOCUMENTS

| | | |
|---|---|---|
| 3,997,367 | * 12/1976 | Yau . |
| 5,055,383 | * 10/1991 | Koblinger et al. . |
| 5,561,076 | * 10/1996 | Yoshino . |
| 5,804,856 | 9/1998 | Ju . |
| 5,811,855 | 9/1998 | Tyson et al. . |
| 5,825,696 | 10/1998 | Hidaka et al. . |
| 5,846,857 | 12/1998 | Ju . |
| 5,877,046 | 3/1999 | Yu et al. . |
| 5,879,975 | 3/1999 | Karlsson et al. . |
| 5,894,152 | 4/1999 | Jaso et al. . |
| 6,107,172 | * 8/2000 | Yang et al. . |
| 6,197,644 | * 3/2001 | Gardner et al. . |
| 6,197,687 | * 3/2001 | Buynoski . |

* cited by examiner

*Primary Examiner*—Charles Bowers
*Assistant Examiner*—Evan Pert
(74) *Attorney, Agent, or Firm*—Renner, Otto, Boisselle & Sklar

(57) ABSTRACT

A method of forming a narrow circuit component on a silicon on insulator (SOI) substrate includes silicon on insulator (SOI) substrate including forming a mask over the surface of a device layer to define an island region surrounded by a peripheral trench region. The mask is trimmed to reduce the size of the island and increase the size of the peripheral trench region. The peripheral trench region is then etched to isolate the island and a circuit component is formed therein

12 Claims, 2 Drawing Sheets

SILICON ON INSULATOR CIRCUIT STRUCTURE WITH EXTRA NARROW FIELD TRANSISTORS AND METHOD OF FORMING SAME

TECHNICAL FIELD

The present invention relates generally to silicon on insulator (SOI) circuit structure fabrication techniques, and more specifically to an SOI field effect transistor (FET) fabrication technique.

BACKGROUND OF THE INVENTION

Conventional or bulk semiconductor transistors are formed in a semiconductor substrate by implanting a well of either P-type or N-type conductivity silicon in a silicon substrate wafer of the opposite conductivity. A field oxide layer functions to prevent surface inversion. Gates and source/drain diffusions are then manufactured using commonly known processes. These form devices known as metal-oxide-semiconductor (MOS) field effect transistors (FETs). Each of these FETs must be electrically isolated from the others in order to avoid shorting the circuits. These FET's are typically interconnected through metal layers above the bulk substrate to form logic circuits. Typically, the interconnections will be structured to interconnect both P-Channel and N-Channel FET's in accordance with known complimentary metal oxide semiconductor (CMOS) techniques to minimize power consumption.

A problem with bulk semiconductor logic circuits is that a relatively large amount of surface area is needed for the electrical isolation of the various FETs which is undesirable for the current industry goals for size reduction. Additionally, junction capacitance between the source/drain and the bulk substrate slows the speed at which a device using such transistors can operate.

In order to deal with the junction capacitance problem and reduce size, silicon on insulator technology (SOI) has been gaining popularity. One method of forming an SOI wafer includes using conventional oxygen implantation techniques to create an insulating buried oxide layer at a predetermined depth below the surface of a bulk wafer. The implanted oxygen oxidizes the silicon into insulating silicon dioxide in a guassian distribution pattern centered at the predetermined depth to form the insulating buried oxide layer. A second method of forming an SOI wafer includes depositing an insulating layer of silicon dioxide on the surface of a first wafer and then bonding such wafer to a second wafer using a heat fusion process.

Utilizing SOI technology, an SOI FET includes a source region and drain region of a first semiconductor type on opposing sides of a channel region of the opposite semiconductor type. An SOI FET is isolated by etching a trench around the periphery of an island in the thin semiconductor layer above the insulating buried oxide layer in the SOI wafer. Appropriate portions of the island are then doped to form the source region, drain region, and channel region. It is recognized in the art that an SOI FET will occupy less surface area on the substrate and, because it is isolated from the silicon substrate by the insulating trench and the insulating buried oxide layer, will have a lower junction capacitance than an equivalent bulk semiconductor FET. This provides for the ability to put larger logic circuits in less space and operate such circuits with reduced power consumption.

However, the power consumption at which an SOI FET can operate is still limited by the dimension between the channel/source junction and the channel/drain junction. While it is recognized that a narrower channel region will provide for reduced power consumption, known SOI fabrication techniques have a limited resolution resulting in a minimum island size.

Accordingly, there is a strong need in the art for an SOI circuit structure, and a method for forming such structure, that includes an SOI FET structure that provides for reduced channel width and reduced FET capacitance to provide for reduced power consumption operation.

SUMMARY OF THE INVENTION

A first aspect of this invention is to provide a method of forming a narrow circuit component on a silicon on insulator wafer, comprising: a) forming a photoresist mask with a length dimension and a width dimension over a silicon device layer to mask a device island region and expose a peripheral trench region; b) trimming a trim region of the photoresist mask to decrease at least one of the length dimension and the width dimension; and c) etching the peripheral trench region of the silicon device layer to isolate the island region. The method may further include forming a silicon nitride layer between the mask and the silicon device layer and the step of etching further includes etching the silicon nitride layer, any buffer oxide and the trench itself in the underlying silicon.

The step of trimming may include eroding the trim region using a chemical selective between the photoresist mask and silicon nitride, such as oxygen/fluorine.

The method of forming a narrow circuit component on a silicon on insulator wafer may further include filling the peripheral trench region with insulating silicon dioxide and may further yet include forming a silicon on insulator field effect transistor in the island region.

A second aspect of this invention is to provide method of forming a narrow circuit component on a silicon on insulator wafer, comprising: a) forming a mask over a silicon device layer to mask a device island region and expose a peripheral trench region with a width dimension; b) trimming a trim region of the photoresist mask to increase the width dimension of the peripheral trench region; and c) etching the peripheral trench region of the silicon device layer to isolate the island region. The method may further include forming a silicon nitride layer between the mask and the silicon device layer and the step of etching further includes etching the silicon nitride layer.

The step of trimming may include eroding the trim region using a chemical selective between the mask and silicon nitride, such as oxygen/fluorine.

The method of forming a narrow circuit component on a silicon on insulator wafer may further include filling the peripheral trench region with insulating silicon dioxide and may further yet include forming a silicon on insulator field effect transistor in the island region.

DESCRIPTION OF THE PREFERRED EMBODIMENTS

Figure 1:
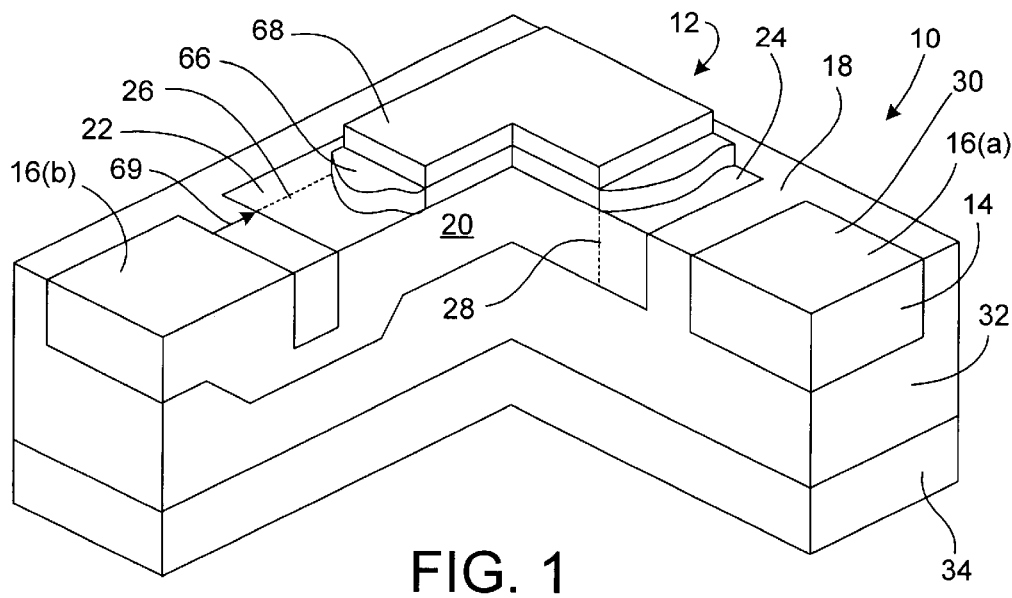
FIG. 1 is a is a perspective view, partially cut away, of a silicon on insulator circuit in accordance with one embodiment of this invention.

The present invention will now be described in detail with reference to the drawings. In the drawings, like reference numerals are used to refer to like elements throughout.

Referring to FIG. 1, silicon on insulator (SOI) circuit 10 of this invention includes field effect transistor (FET) 12 formed in a silicon device layer 14 and isolated from other devices 16(a) and 16(b) formed in the silicon device layer 14 by a peripheral insulating trench 18. The FET 12 includes a gate oxide layer 66 and a polysilicon gate 68 which defines a central channel region 20, and a source region 22 and a drain region 24 on opposing sides of the central channel region 20. In the exemplary embodiment of this invention, the channel region 20 is preferably P-conductivity silicon while the source region 22 and the drain region 24 are each N-conductivity silicon to form two semiconductor junctions 26 and 28. However, in accordance with known silicon technology, the channel region 20 may be N-conductivity silicon while each of the source region 22 and the drain region 24 are P-conductivity silicon. The insulating trench 18 extends from the top face 30 of the SOI circuit 10 to an insulating buried oxide layer 32. The buried oxide layer 32 is on top of a base substrate 34. It should be appreciated that FET 12, fabricated in accordance with the methods described herein, has a channel region with a width 69, extending the width of the semiconductor junctions 26 and 28, that is narrower than that of a FET fabricated using known fabrication techniques.

Figure 2A:
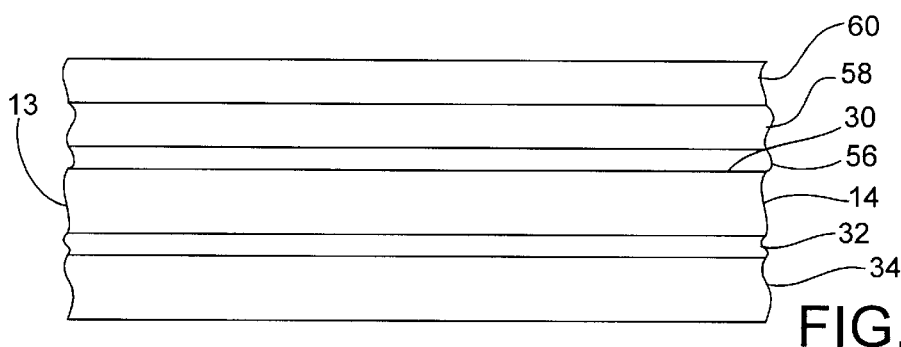
FIG. 2(a) is a cross sectional view of a first step in the fabrication of a silicon on insulator circuit structure in accordance with this invention.
Figure 3:
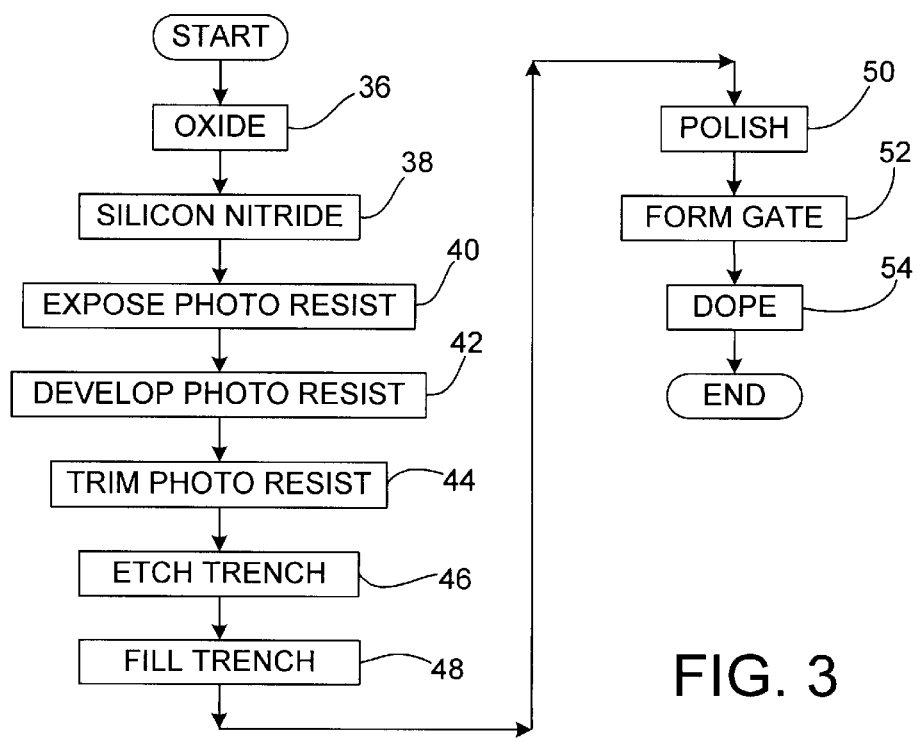
FIG. 3 is a flow chart showing a fabrication process for forming a silicon on insulator circuit in accordance with one embodiment of this invention.

Referring to FIG. 2(a) in conjunction with the flowchart of FIG. 3, a first step in the fabrication of FET 12 includes forming a film oxide layer 56 approximately 100–150 Angstroms thick on the surface 30 of the SOI wafer 13 at step 36. At step 38, a silicon nitride layer 58 approximately 1,000 to 1,500 Angstroms thick is deposited on top of the film oxide layer 56 and at step 40, a photoresist mask layer 60 is deposited on top of the silicon nitride layer 58.

Figure 2B:
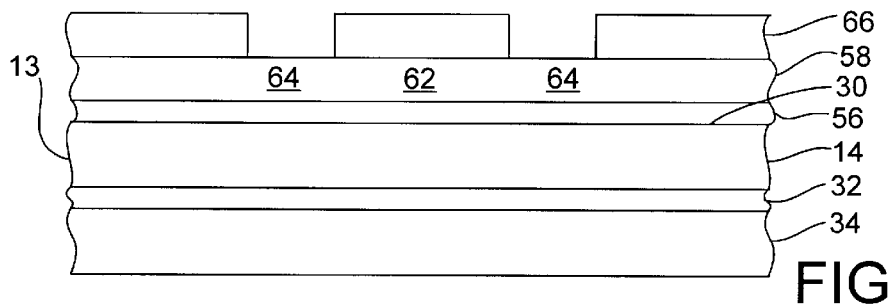
FIG. 2(b) is a cross sectional view of a second step in the fabrication of a silicon on insulator circuit structure in accordance with this invention.

At step 42, using conventional photolithography techniques, the photoresist layer 60 is patterned and exposed to define island region 62 and insulating trench regions 64 as shown in FIG. 2(b). More specifically, a UV light source and a reticle provide collimated illumination used to expose and pattern the photoresist 60. At step 43, a developer solution hardens the unexposed areas of the photoresist 60 and washes the photoresist 60 away in the exposed portions thereby leaving the unexposed portions as a photoresist mask 66 on the surface of the silicon nitride layer 58. It should be appreciated that the photolithography processes discussed with respect to steps 42 and 43 have a resolution limit that limits the minimum size of both the island region 62 and the insulating trench regions 64. Therefore, because one of the objectives of this invention is to provide transistors smaller than the limits of resolution of the photolithography processes, in the preferred embodiment, the photolithography processes are used to make the minimum sized island region 62 in accordance with known methods. Known photolithography processes can be used to form island region 62 with a minimum length dimension of approximately 450–750 nm and a minimum width dimension of approximately 250–400 nm. However, the actual dimensions of the island 62 formed with photolithography processes is expected to decrease as advances are made in the art of photolithography and therefore such dimensions do not limit the scope of this invention. The minimum sized island region 62 is then further trimmed in the steps discussed below.

Figure 2C:
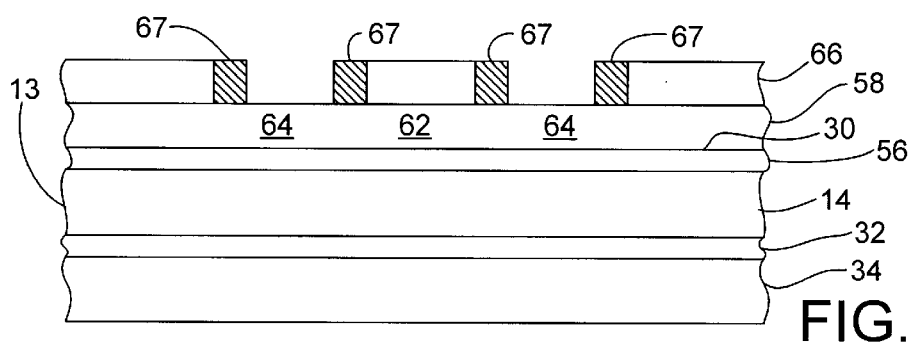
FIG. 2(c) is a cross sectional view of a third step in the fabrication of a silicon on insulator circuit structure in accordance with this invention.

Referring to FIG. 2(c), at step 44, the photoresist mask 66 is trimmed to remove portions 67 to narrow at least one of the length dimension and the width dimension of masked island region 62 and to correspondingly widen insulating trench regions 64. In the preferred embodiment, the width of removed portions 67 is on the order of 400 angstroms such that masked island region 62 is narrowed by approximately 800 angstroms (e.g. twice the width of removed portions 67) and insulating trench region 64 is widened by approximately 800 angstroms (e.g. twice the width of removed portions 67). The trimming is typically performed using an oxygen/fluorine erosion process to erode portions 67 of the photoresist mask 66. It should be appreciated that because the erosion also erodes some of the thickness of the photoresist mask 66, the thickness of the photoresist mask 66, prior to erosion should be on the order of 6200–7500 angstroms so that after erosion, the thickness will be on the order of 5400–6700 angstroms which is sufficient to mask the silicon nitride layer 58.

Figure 2D:
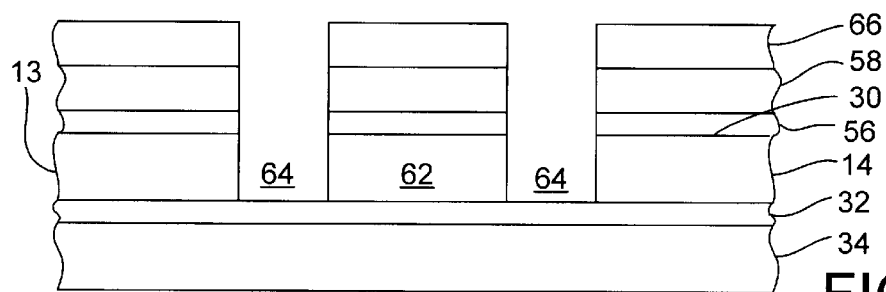
FIG. 2(d) is a cross sectional view of a fourth step in the fabrication of a silicon on insulator circuit structure in accordance with this invention.

At step 46, a dry etch utilizing a first etching chemistry selective between the photoresist mask 60 and the silicon nitride layer 58 removes the silicon nitride layer 58 in the areas that are not masked with the photoresist 60 thereby creating the silicon nitride mask below the photoresist mask and a dry etch utilizing a second etching chemistry selective between the silicon nitride mask and the silicon substrate of the silicon device layer 14 removes the silicon in insulating trench regions 64 as shown in FIG. 2(d).

Figure 2E:
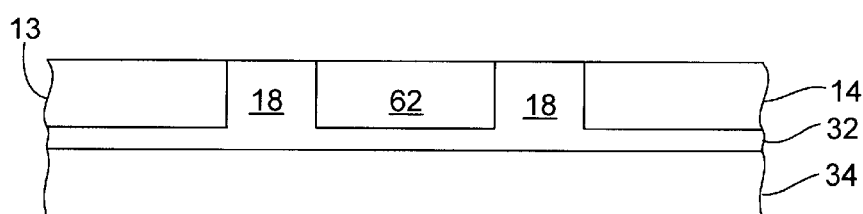
FIG. 2(e) is a cross sectional view of a fifth step in the fabrication of a silicon on insulator circuit structure in accordance with this invention.

At step 48, the insulating trench regions 64 are filled with silicon dioxide to form insulating trenches 18. Filling the insulating trench regions 64 preferably uses any known technique for forming silicon dioxide in an open trench such as surface reaction of SiH4 or TEOS with oxygen to form silicon dioxide as shown in FIG. 2(e). After the insulating trenches 18 are formed, the surface of the wafer is polished using a chemical mechanical polish at step 50 to remove any excess silicon dioxide layer and the remaining silicon nitride mask.

Figure 2F:
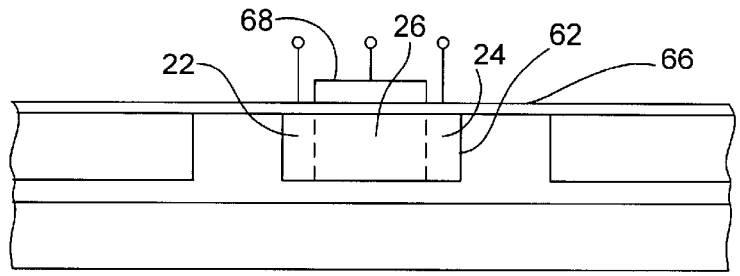
FIG. 2(f) is a cross sectional view of a sixth step in the fabrication of a silicon on insulator circuit structure in accordance with this invention.

At step 52, a gate oxide layer 66, and a polysilicon gate 68 are formed on the top surface 30 of the substrate 13 to define the channel region 26 in a conventional CMOS self aligned gate, source, and drain process. The gate oxide layer 66 is typically grown on the surface of the island region 62 using a thermal oxidation process and a polysilicon layer is deposited on top of the gate oxide layer 66 using a low pressure chemical vapor deposition (LPCVD) process. The polysilicon layer is then patterned and etched using known photolithography methods and photoresist trimming methods as discussed earlier to create polysilicon gate 68 which defines the channel region of the FET 12 of this invention as shown in FIG. 2(f).

At step 54, the portions of the silicon substrate silicon on opposing sides of the P-type silicon in the channel region 26 of the FET 12 that are not masked by the gate applied at step 52 are doped into N-type silicon. Doping is typically performed using Ion implantation techniques. Ions of an N-type dopant, such as arsenic, are accelerated to a high velocity in an electric field and impinge on the SOI wafer 13. Because the ions cannot penetrate the polysilicon gate, the polysilicon gate effectively operates as a mask that results in doping only the exposed source region 22 and drain region 24.

It should be appreciated that the foregoing processes of fabricating a field effect transistor on a silicon on insulator wafer results in a unique transistor structure that provides for reduced channel width over known SOI FET structures. Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of forming a narrow circuit component on a silicon on insulator wafer, comprising:
    a) forming a mask with a length dimension and a width dimension over a silicon device layer to mask a device island region and expose a peripheral trench region;
    b) trimming a trim region of the mask to decrease at least one of the length dimension and the width dimension; and
    c) etching the peripheral trench region of the silicon device layer to isolate the island region.

2. The method of forming a narrow circuit component on a silicon on insulator wafer of claim 1, further including forming a silicon nitride layer between the mask and the silicon device layer and the step of etching further includes etching the silicon nitride layer.

3. The method of forming a narrow circuit component on a silicon on insulator wafer of claim 2, wherein the step of trimming includes eroding the trim region using a chemical selective between the mask and silicon nitride.

4. The method of forming a narrow circuit component on a silicon on insulator wafer of claim 3, further including filling the peripheral trench region with insulating silicon dioxide.

5. The method of forming a narrow circuit component of a silicon on insulator wafer of claim 4, further including forming a silicon on insulator field effect transistor in the island region.

6. The method of forming a narrow circuit component on a silicon on insulator wafer of claim 5, wherein the chemical selective between the mask and the silicon dioxide is oxygen/fluorine.

7. A method of forming a narrow circuit component on a silicon on insulator wafer, comprising:
    a) forming a mask over a silicon device layer to mask a device island region and expose a peripheral trench region with a width dimension;
    b) trimming a trim region of the mask to increase the width dimension of the peripheral trench region; and
    c) etching the peripheral trench region of the silicon device layer to isolate the island region.

8. The method of forming a narrow circuit component on a silicon on insulator wafer of claim 7, further including forming a silicon nitride layer between the mask and the silicon device layer and the step of etching further includes etching the silicon nitride layer.

9. The method of forming a narrow circuit component on a silicon on insulator wafer of claim 8, wherein the step of trimming includes eroding the trim region using a chemical selective between the mask and silicon nitride.

10. The method of forming a narrow circuit component on a silicon on insulator wafer of claim 9, further including filling the peripheral trench region with insulating silicon dioxide.

11. The method of forming a narrow circuit component of a silicon on insulator wafer of claim 10, further including forming a silicon on insulator field effect transistor in the is land region.

12. The method of forming a narrow circuit component on a silicon on insulator wafer of claim 11, wherein the chemical selective between the mask and the silicon dioxide is oxygen/fluorine.

* * * * *